United States Patent [19]
Kirk

[11] Patent Number: 5,808,731
[45] Date of Patent: Sep. 15, 1998

[54] SYSTEM AND METHOD FOR VISUALLY DETERMINING THE PERFORMANCE OF A PHOTOLITHOGRAPHY SYSTEM

[75] Inventor: Joseph P. Kirk, Chelsea, N.Y.

[73] Assignee: International Business Machines Corporation, Armonk, N.Y.

[21] Appl. No.: 903,662

[22] Filed: Jul. 31, 1997

[51] Int. Cl.$^6$ .................................................. G01B 9/00
[52] U.S. Cl. ................................................ 356/124
[58] Field of Search ............................................. 356/124

[56] References Cited

FOREIGN PATENT DOCUMENTS 5-273740  10/1993  Japan ..................................... 356/124

OTHER PUBLICATIONS

Lindsay, et al; "Comparison of state-of-the-art DUV lenses"; *The International Society for Optical Engineering*, vol. 2440, Feb. 1995; pp. 678–689.

Freischlad, et al; "*The International Society for Optical Engineering*," vol. 2440, Feb. 1995; pp. 743–749.

Lagerquist, et al; "*The International Society for Optical Engineering*," vol.2725, Apr. 1996; pp.494–503.

Grenville, et al; "J. Vac.Sci.Technol. B, Microelectron. Nanometer Struct.. (USA), vol. 12, No. 6; Dec. 1994; pp. 3814–3819.

*Primary Examiner*—F. L. Evans
*Attorney, Agent, or Firm*—Schmeiser, Olsen & Watts; H. Daniel Schnurmann

[57] ABSTRACT

The preferred embodiments of the present invention provide a method and apparatus for visually inspecting features on a wafer that are smaller than can be optically resolved using normally using visible light. By providing a method for visually inspecting the features, the overall performance of the fabrication system can be determined. The preferred method patterns resist with two patterns having different spatial frequencies. The patterns combine to form a pattern in the resist that exhibits Moire beats. The Moire beat spatial frequency of the resulting pattern is significantly lower than the two spatial frequencies used, and thus can be visually inspected using light in the visible regions.

23 Claims, 9 Drawing Sheets

SYSTEM AND METHOD FOR VISUALLY DETERMINING THE PERFORMANCE OF A PHOTOLITHOGRAPHY SYSTEM

BACKGROUND OF THE INVENTION

1. Technical Field

This invention generally relates to semiconductor processing and more specifically relates to inspection procedures for semiconductor processing.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced while maintaining an acceptable fabrication yield. To maintain acceptable fabrication yields constant monitoring of the fabrication process is required. This is typically accomplished through the use of various inspection procedures. In particular, after various processing steps wafers are removed from the fabrication line and the features in those wafers inspected. This inspections look for defects and other indicators of how well the fabrication line is preforming. The data from these inspections can be used to make adjustments to improve the fabrication efficiency.

Unfortunately, as fabrication technology advances and the feature size of the various devices in a wafer decreases, it becomes increasingly difficult to inspect the features in the wafer. As the feature size of the modem integrated devices decreases it becomes more difficult to optically resolve the feature sizes when using light in the visible regions. The problem is that the line widths produced by state of the art lithography tools are comparable to the wave length of visible light. This makes it impossible to optically resolve the printed lines. For example, the current advanced fabrication system can print lines having a width of less than 0.25 microns, while the light used in the inspection process typically is in the visible range at approximately 0.5 microns. With the line width smaller than the wavelength of light used by the inspection tool, it is impossible for the inspection tool to optically resolve the line. Without the ability to inspect features on the wafer it is impossible to determine the performance of the fabrication system.

To avoid this problem tools such as scanning electron microscopes (SEM) are commonly used to inspect the features on the wafer. Tools such as SEMs allow the inspection of features that are smaller than can be optically resolved using visible light. Unfortunately, SEMs are a very costly and complex technology, and require that the wafer be removed from the fabrication process for visual inspection. This means that the use of the SEM is a less than ideal solution to the inspection problem.

Therefore what is needed is an inspection apparatus and method that can be used in situ to inspect features on a wafer that are smaller than can be currently optically resolved using visible light, allowing the performance of the fabrication system to be accurately determined.

DISCLOSURE OF INVENTION

According to the present invention, a method and apparatus for visually inspecting features on a wafer that are smaller than can be optically resolved is provided. This allows the performance of a semiconductor fabrication system to be accurately determined. The preferred method exposes resist with a pattern having a first spatial frequency. The resist is then exposed with a second pattern having a second, different spatial frequency. The two patterns with different spatial frequencies combine to form a pattern in the resist that exhibits Moire beats. The beat spatial frequency of the resulting pattern is significantly lower than the two spatial frequencies used. By visually inspecting the Moire beat pattern, the depth of frequency modulation of the unresolved lines can be determined. From this the general performance of the fabrication system can be evaluated.

It is thus an advantage of the present invention to facilitate the use of visual inspections for features having widths substantially less then the wavelength of the visible light without excessive costs and complexity.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
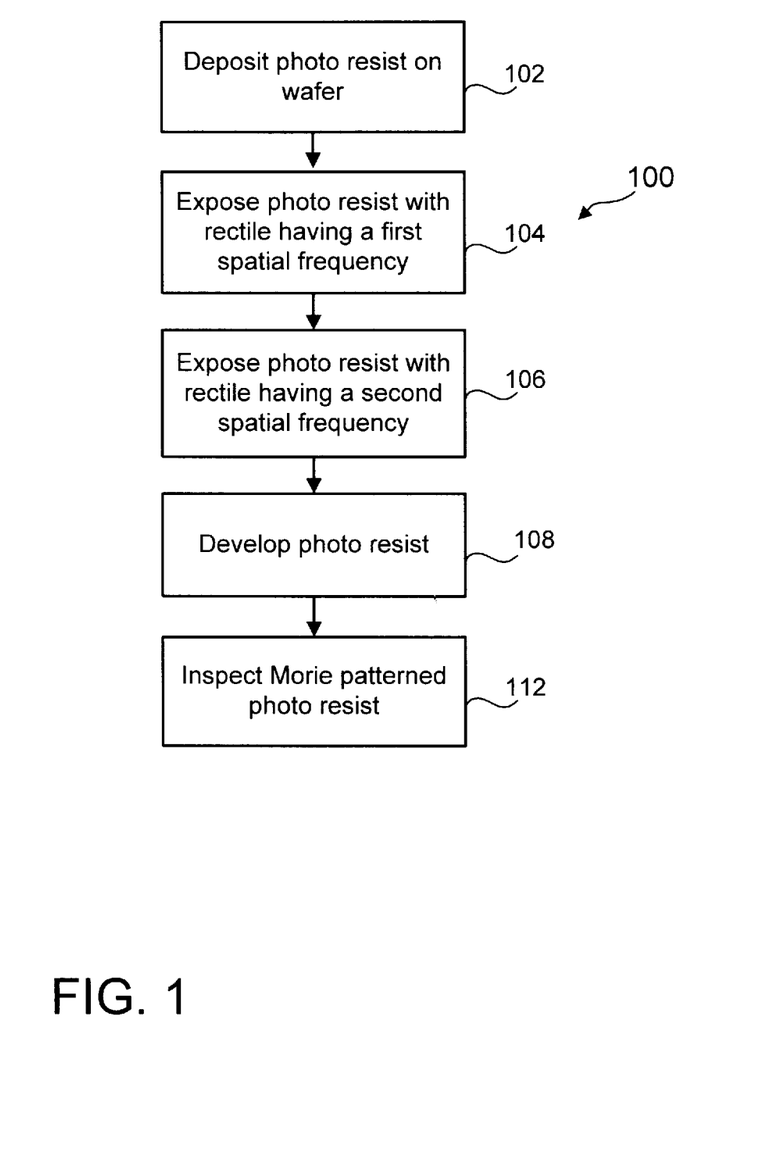
FIG. 1 is a flow diagram illustrating the preferred embodiment method.

The preferred embodiments of the present invention provide a method and apparatus for visually inspecting features on a wafer that are smaller than can be optically resolved using normally visible light. By providing a method for visually inspecting the features, the overall performance of the fabrication system can be determined. The preferred method patterns resist with two patterns having different spatial frequencies. The patterns combine to form a pattern in the resist that exhibits Moire beats. The Moire beat spatial frequency of the resulting pattern is significantly lower than the two spatial frequencies used, and thus can be visually inspected using light in the visible regions Turning to FIG. 1, a flow diagram illustrates a method 100 for visually evaluating the performance of a photolithography system. The method 100 can be used in any environment but is particularly suited for determining the accuracy of printed lines that have a width smaller than could be normally optically resolved.

Figure 2:
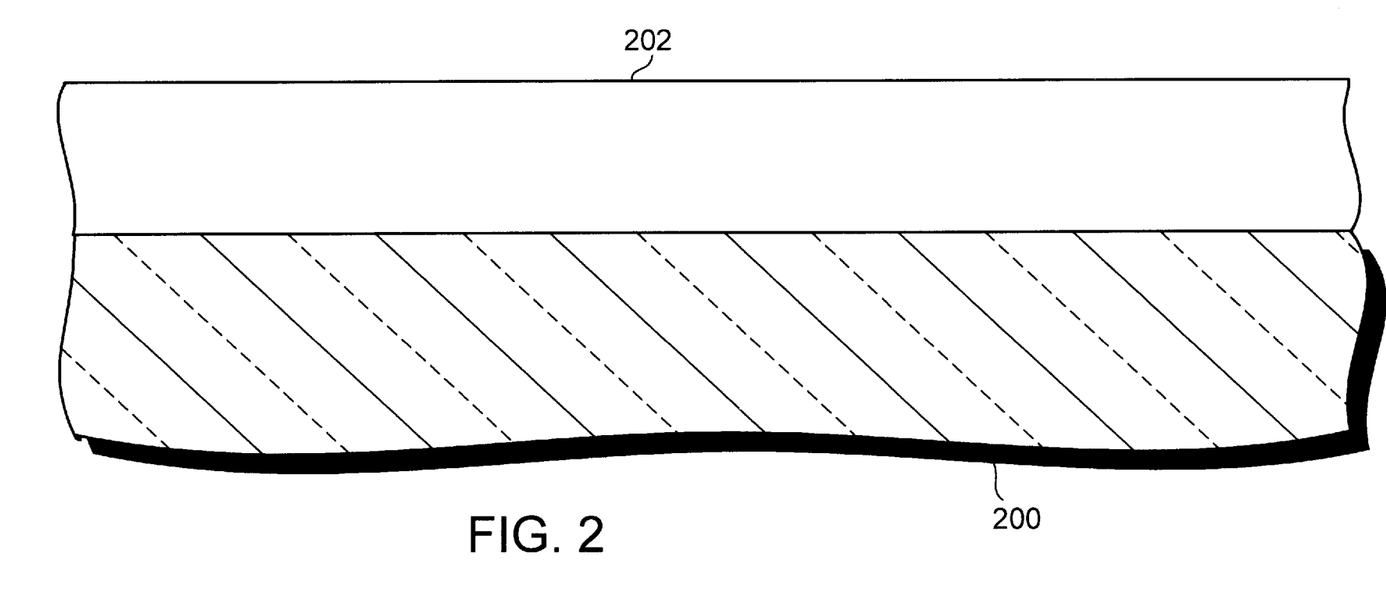
FIG. 2 is cross sectional side view of wafer portion with photoresist in accordance with the preferred embodiment.

The first step 102 in method 100 is to deposit photoresist on the wafer. The resist is preferably positive tone resist, but other types of resist may be used. Turning to FIG. 2, a cross section of wafer portion 200 is illustrated with a deposited layer of photoresist 202 on the surface. Preferably, the photoresist used has a high absorption coefficient at the relevant exposure wavelengths (where the absorption coefficient describes the rate at which light is absorbed as it propagates in the material). Additionally the resist is preferably deposited deep enough that the total exposure in later steps will progress only part way through the photoresist. By using a sufficiently deep amount of high absorption coefficient (preferably with $\alpha > 1.0$/micron (base 10)) resist, the preferred method will form a continuous tone relief pattern (i.e., the relief proportional to the dose) in the resist. The depth of features in this pattern will be proportional to the logarithm of the exposure dosage.

It should be noted that the resist formulation and amount used would typically be different than that used in normal fabrication processing. In particular, in regular processing sharp contrast between areas of almost no resist remaining or almost no resist removed is desired. By contrast, in the preferred embodiment a continuous tone relief pattern is desirable to facilitate visual inspections of the patterned resist.

An example of a resist formulation that has a suitable high absorption coefficient when used in deep UV (~240 nm) tools is AZ750 produced by Hoechst Celanese Corp. AZ750 is a resist that was designed to be used in fabrication in mid UV (~360 nm) tools. As such, the resist is essentially transparent at mid UV wavelengths, but is nearly opaque and has a high absorption coefficient suitable for use in the preferred embodiments when used in deep UV wavelengths.

Of course other suitable resist formulations can be used depending on the exposure wavelength of the lithography system. Additionally, materials other than photoresist could be used that record exposures and create a surface relief structure patterned after the exposure.

The next step 104 in method 100 is to expose the photoresist with a pattern having a first spatial frequency. This is preferably accomplished by exposing the photoresist through a mask containing a reticle that defines lines at the first spatial frequency.

Figure 3:
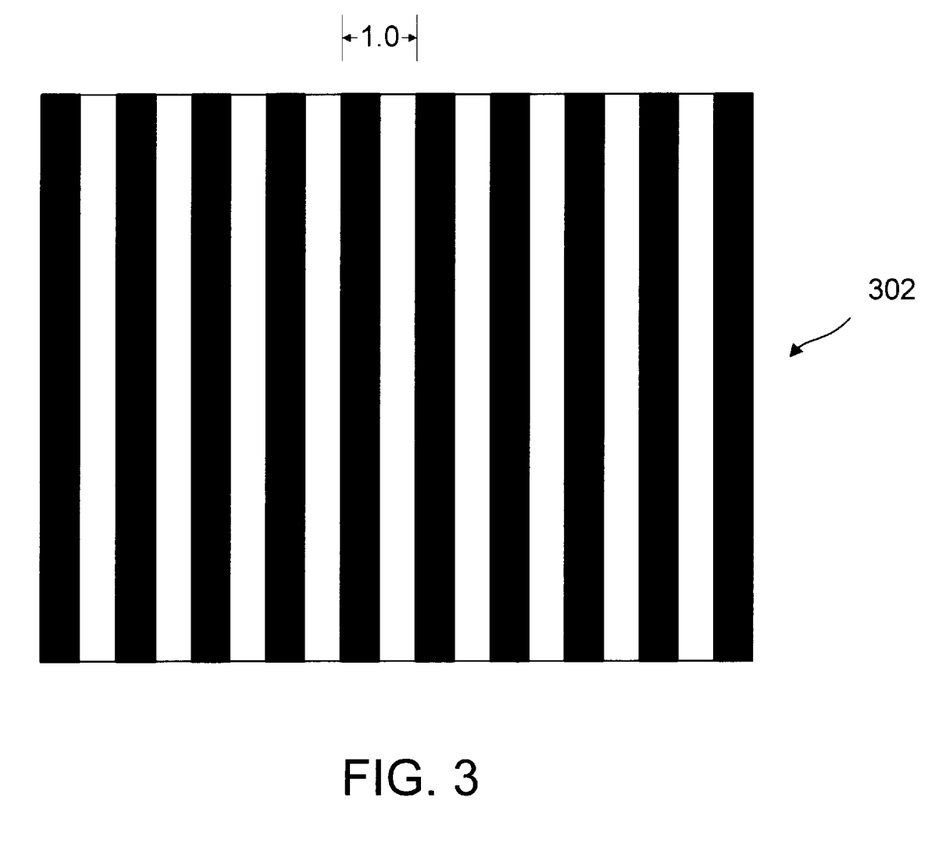
FIG. 3 is a schematic view of a set of lines having a spatial frequency.

The spatial frequency of a pattern is defined as the inverse of its spatial period, and is a function of how its pattern repeats in space. For example, turning to FIG. 3, a pattern of lines 302 is illustrated. Assume that each dark line in the pattern has a width of 0.5 $\mu$m, and each dark line is separated from adjacent dark lines by a 0.5 $\mu$m white space. This pattern of dark line, space, dark line has a spatial period (the width of repeating portions) of 1 $\mu$m, and thus would have a spatial frequency of 1000 cycles/mm.

A similar pattern having a spatial frequency can be created in photoresist by exposing the resist with an exposure having a spatial period. For example, exposing photo resist through a reticle which contains blocking shapes with a width of 0.25 $\mu$m separated by transparent shapes with a width of 0.25 $\mu$m creates an exposure pattern in the resist with a spatial period of 0.5 $\mu$m and a spatial frequency of 2000 cycles/mm.

Figure 4:
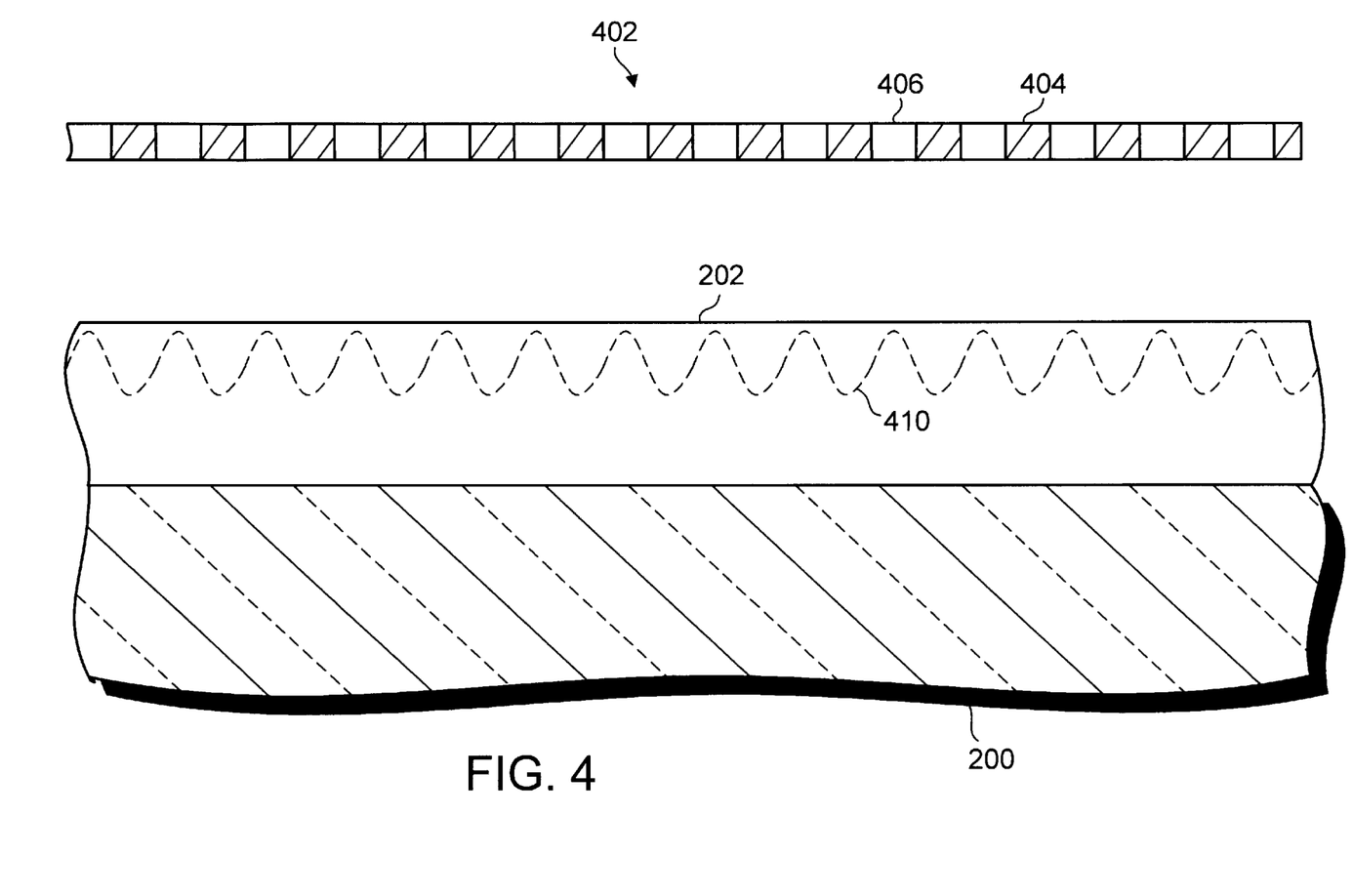
FIG. 4 is cross sectional side view of the wafer portion of FIG. 2 with photoresist patterned through a first mask portion with a first spatial frequency in accordance with the preferred embodiment.

Turning to FIG. 4, the wafer portion 200 is illustrated after the photoresist 202 has been exposed through an exemplary mask portion 402. FIG. 4 shows a cross section of mask portion 402. The exemplary mask portion 402 is illustrative of the type of reticle that would be used to create a plurality of parallel lines in the photoresist, and thus includes a plurality of blocking lines 404 and a plurality of non-blocking lines 406. Exposing photoresist through mask portion 402 exposes the photoresist with a pattern having a first spatial frequency as defined by blocking lines 404 and non-blocking lines 406. This creates an exposure pattern in the photoresist, and that exposure pattern in the photoresist has the same spatial frequency as the mask portion 402.

Of course a mask portion containing a plurality of lines is only one type of mask that could be to expose the photoresist to a pattern having a first spatial frequency. Other reticle patterns could be used as long as the created exposure pattern in the resist repeats and thus has a spatial frequency.

In FIG. 4, the exposure through mask portion 402 creates an exposure pattern in photoresist 202. In particular, exposure through mask portion 402 exposes the photoresist areas above dotted line 410, while areas below dotted line 404 remain unexposed. This exposure pattern in the photoresist 402 has the same fundamental spatial frequency as the mask portion 410.

As discussed above, the created exposure pattern is dependent on the amount of exposure and the absorption coefficient of the photoresist. In the preferred embodiment where the photoresist has a high absorption coefficient, the created exposure pattern is a continues tone relief pattern as illustrated.

The next step 106 in method 100 is to expose the photoresist with a pattern having a second spatial frequency. As with step 104, this is preferably accomplished by exposing the photoresist through a mask containing a reticle that defines lines at the second spatial frequency.

Exposing the photoresist with a second pattern having a second spatial frequency combines with the first exposure to create an exposure pattern in the photoresist that exhibits Moire beats.

Figure 5:
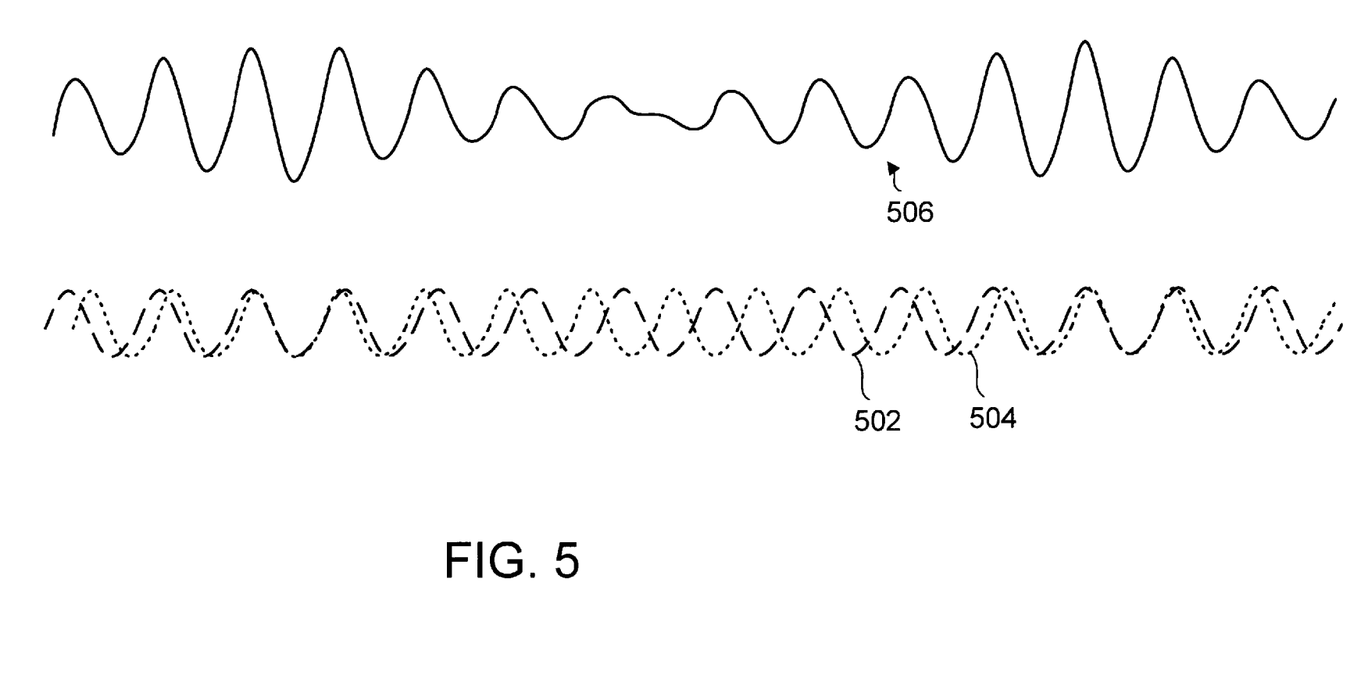
FIG. 5 is a schematic view of two sinusoidal waves and their resulting Moire beat pattern.

Moire beats, commonly referred to as beats, are created when two standing wave patterns having different frequencies are combined together. Turning to FIG. 5, a sinusoidal wave pattern 502 having a first frequency, and a sinusoidal wave pattern 504 having a second frequency are illustrated. When wave 502 is combined with wave 504, the resulting wave pattern 506 exhibits relatively slow modulations that are known as beats. These beats are formed by the two waves going from in phase with each other to out of phase. In areas where the two waves are nearly in phase, the amplitude of the resulting wave is high, forming the beat. In areas where the two waves are mostly out of phase, the two waves cancel each other out, forming the low amplitude areas between beats. The frequency of the beat envelope is equal to the difference between the frequencies of the two combining waves. Similar beat patterns result can result from the combination of many types of waves, including sound waves, electromagnetic waves, and spatial waves.

Figure 6:
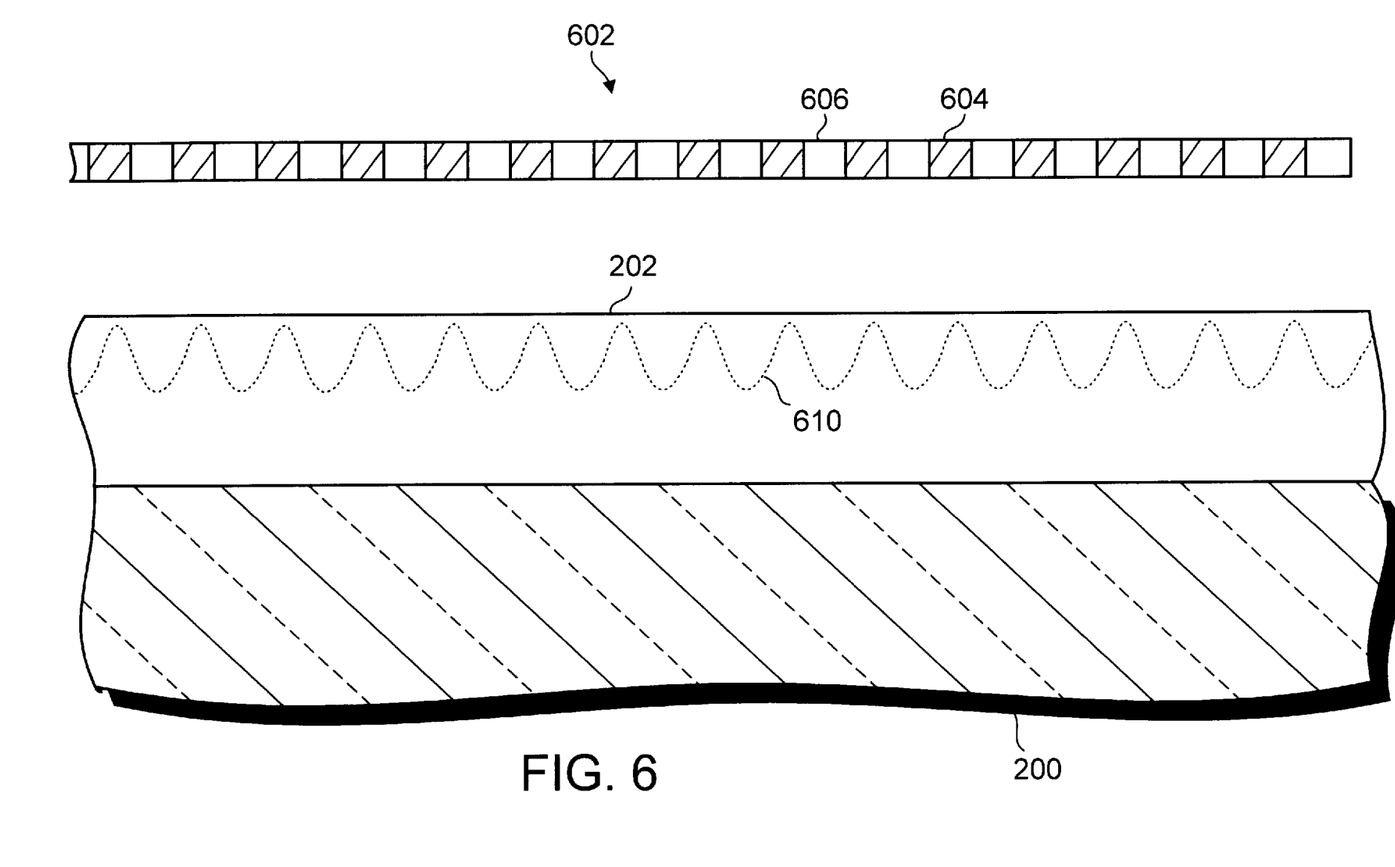
FIG. 6 is cross sectional side view of the wafer portion of FIG. 4 with photoresist patterned through a second mask portion with a second spatial frequency in accordance with the preferred embodiment.

Turning to FIG. 6, the wafer portion 200 is illustrated after the photoresist 202 has been exposed through an second exemplary mask portion 602. The second exemplary mask portion 602 is similar to the first mask portion 402, except that the spatial frequency of the reticle is slightly different. Thus, exposing the photoresist 202 through mask portion 602 exposes the photoresist with a pattern having a second spatial frequency as defined by blocking lines 604 and non-blocking lines 606. This creates an second exposure pattern in the photoresist, and that second exposure pattern in the photoresist has the same second spatial frequency.

In FIG. 6, an exposure pattern in photoresist is illustrated that would result from an exposure through mask portion 602 if the previous exposure had not occurred. Again, this exposes the photoresist areas above dotted line 610, while areas below dotted line 404 remain unexposed, with the exposure pattern having the same spatial frequency as mask portion 610.

Figure 7:
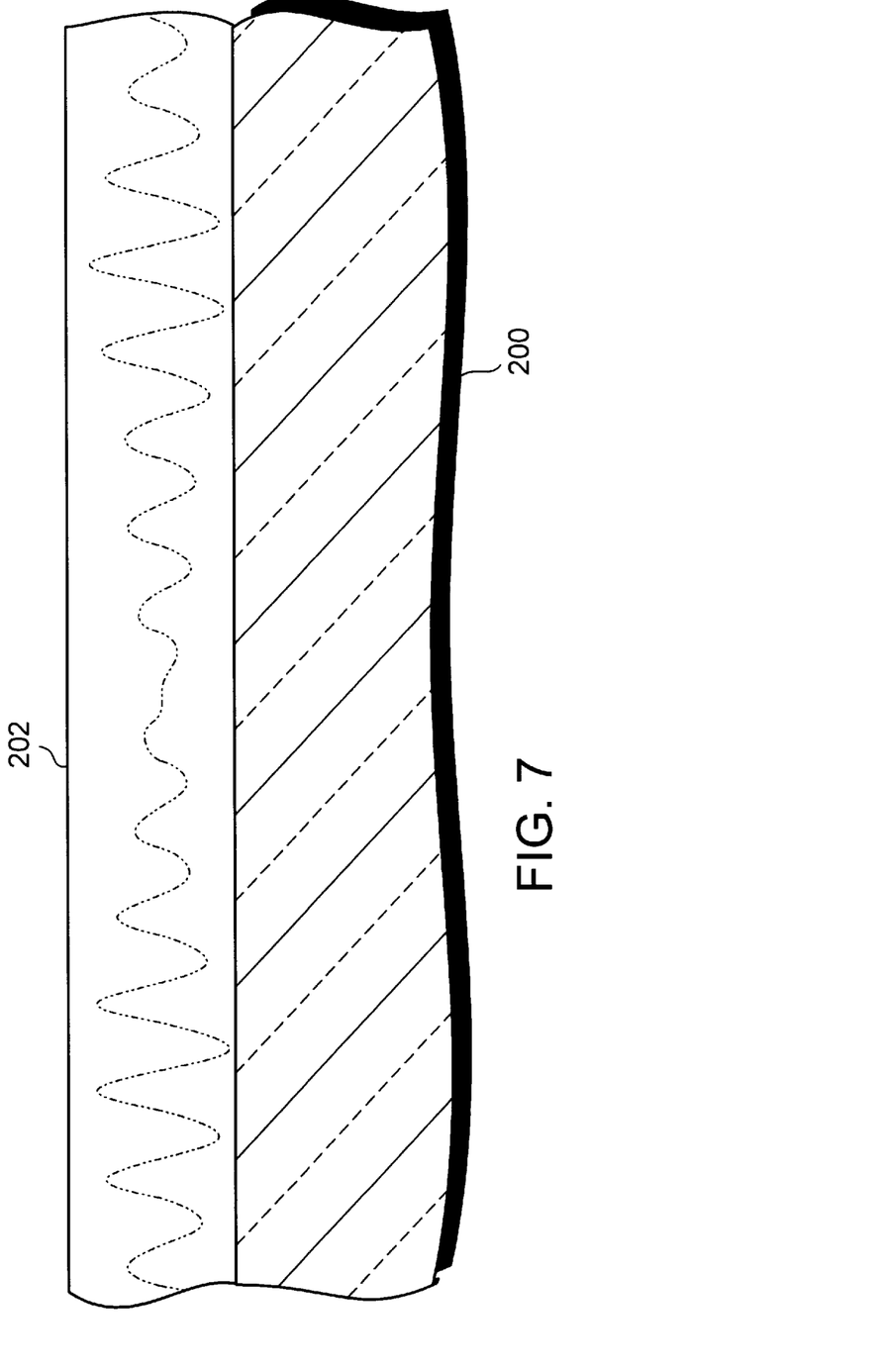
FIG. 7 is cross sectional side view of the wafer portion of FIG. 6 with photoresist patterned with two exposures in accordance with the preferred embodiment.

In the preferred embodiment where a first exposure at a different spatial frequency preceded the second exposure, the two exposures combine to form a beat modulated exposure region. Turning to FIG. 7, the wafer portion 200 is illustrated after a first exposure through mask portion 402 and a second exposure through mask portion 602. The resulting exposure pattern exhibits beat modulation. In particular, in areas where both exposures were near phase alignment, the exposures constructively combined together to form a high amplitude "beat" exposure pattern. In areas where the exposures were out of alignment the two exposures do not constructively add together, and thus are not as exposed as deeply into the photo resist.

Again, in the preferred embodiment where the photoresist has a high absorption coefficient, the created beat exposure pattern is a continuous tone relief pattern as illustrated.

Figure 8:
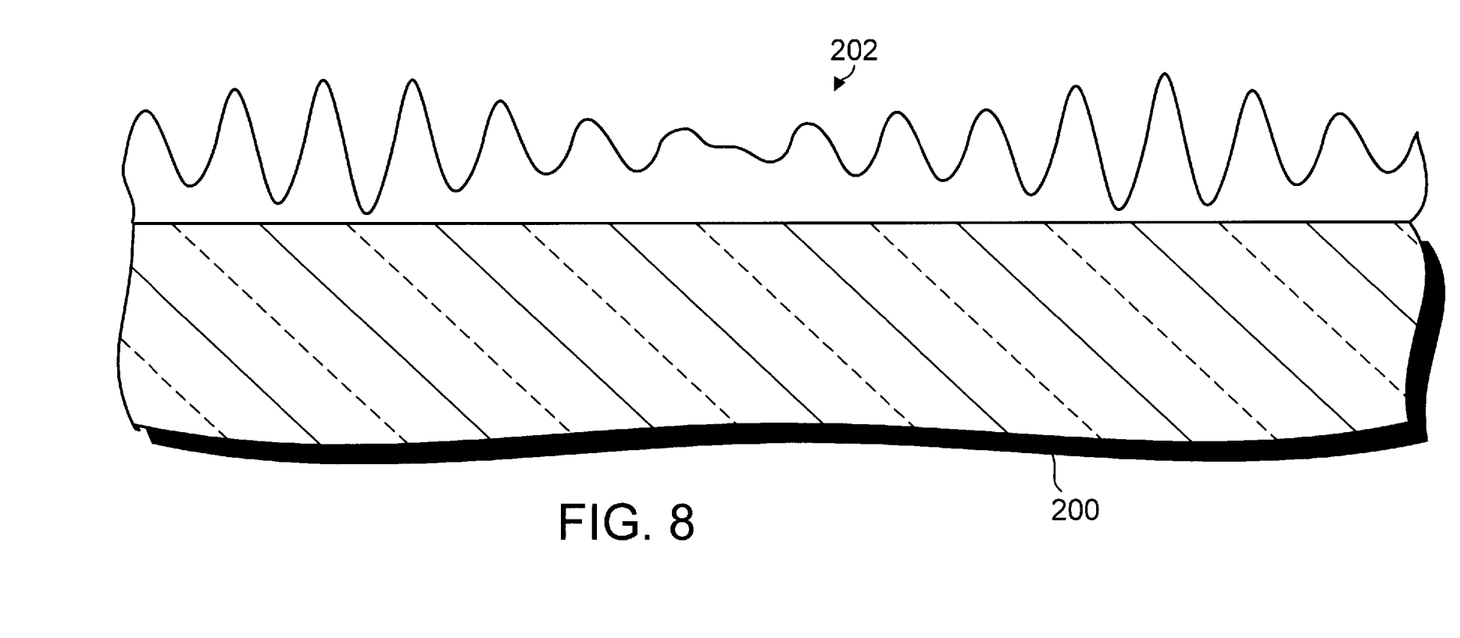
FIG. 8 is cross sectional side view of the wafer portion of FIG. 7 with photoresist developed after being patterned with two exposures in accordance with the preferred embodiment.

The next step 108 is to develop the photoresist. In the case of positive tone resist, the exposed areas wash away in the development step, leaving the unexposed areas of resist. Turning to FIG. 8, the wafer portion 200 with resist 202 is illustrated having been exposed twice and developed in accordance with the preferred embodiment. The resulting pattern of resist exhibits beat modulation as discussed above, with the shape of the features in this pattern proportional to the logarithm of the exposure dosage. In particular, the photoresist has recorded both exposures and been developed to form a surface relief structure that is modulated according to the Moire beat frequency.

The beat frequency of the pattern (and hence the spatial period) is quite low compared to the frequency of the two line patterns by themselves, and can be optically resolved with light in the visible range. Thus, by making two exposures with two different spatial frequencies, the high frequency information that is above the cutoff frequency of the optical inspection tool is down shifted in the form of the Moire beat frequency to well below the optical cutoff frequency of the inspection microscope. In other words, although the individual lines that make up the beat pattern may be two small to be visually detected, the resulting beat pattern can be visually inspected.

The beat pattern is preferably visually inspected to determine the depth of modulation of the Moire beat pattern. The depth of modulation (i.e., the amplitude of the wave forms in the beats) that occurs when two patterns superimpose to form a Moire beat pattern is a function of the integrity (e.g., the sharpness, clarity, straightness, etc.) of the underlying spatial patterns. If the underlying spatial patterns were well formed in the process, the depth of modulation will be greater than if the underlying lines were not well defined. The amount of modulation is thus directly related to the quality of the underlying, unresolved high frequency lines. Thus, by determining the depth of modulation, the integrity of the underlying lines (that are otherwise invisible in an optical inspection system) can be determined. From this determination the performance of the lithography system (e.g., the lens performance) can be evaluated.

The depth of modulation of the Moire is easily determined by measurement of the diffracted orders. Diffracted orders are patterns of light created when monochromatic reflects of a grating. In the preferred embodiment, the Moire pattern is illuminated with light and the resulting diffracted orders are measured by comparing the diffraction orders with those of a known profile.

In the preferred embodiment many different combinations of spatial patterns are used to test the performance of a lithography system. Preferably, many different Moire patterns are formed using different spatial frequencies, from relatively low spatial frequency combinations to relatively high spatial frequencies combinations. In a system that is performing well Moire beats with a high depth of modulation will be formed from higher frequency patterns than a poor performing system will. Thus, by visually inspecting a set of Moire patterns to determine what spatial frequency combinations form well-defined Moire patterns the performance of the lithography system as a function of spatial frequency can be determined. Additionally, by forming Moire patterns at different foci, line directions and different locations the performance of the lithography tool as a function of those variables can be determined and compared to other tools.

Figure 9:
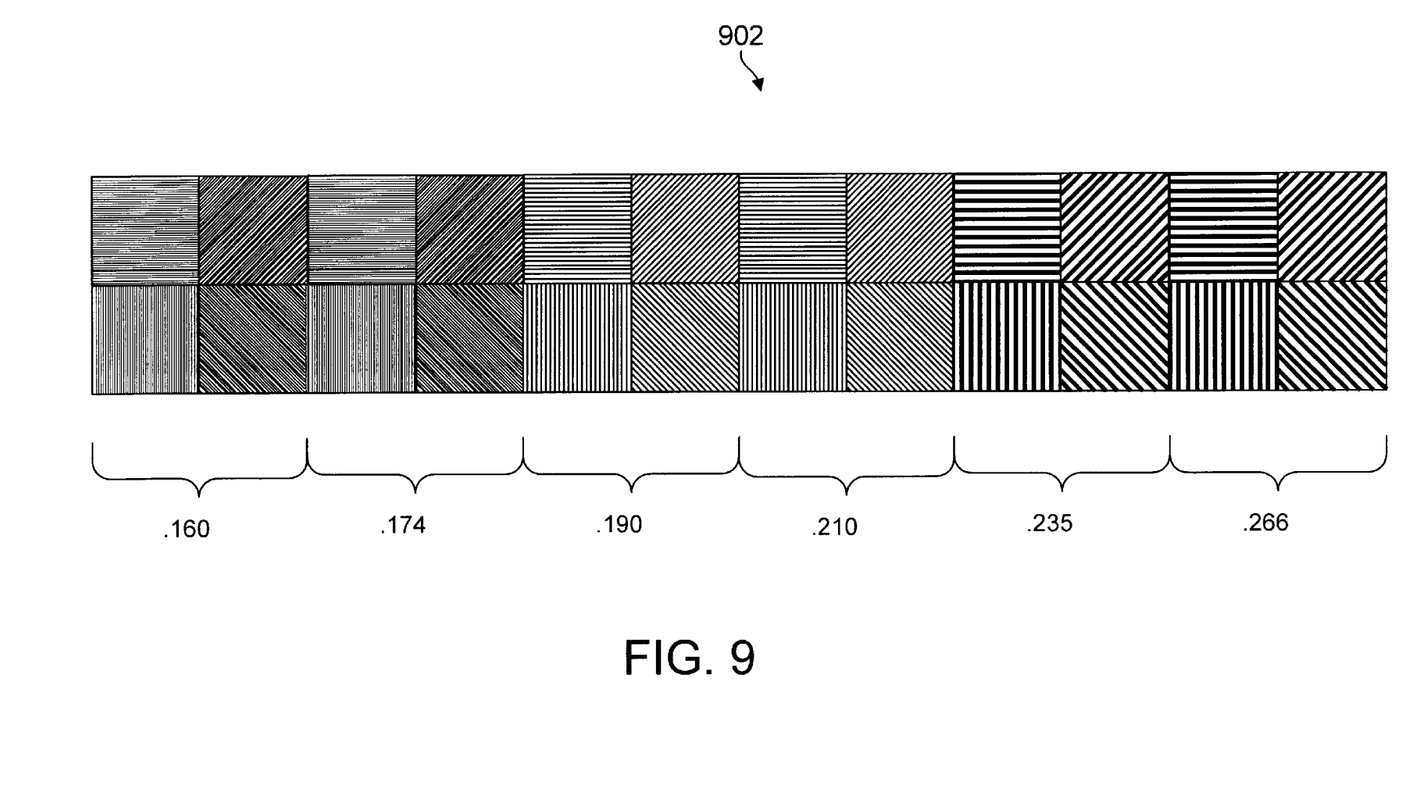
FIG. 9 is a schematic view of a reticle used in accordance with the preferred embodiment.

Turning to FIG. 9 a reticle portion 902 is illustrated (not to scale) that can be used in accordance with the preferred embodiment. The reticle portion 902 includes four sets of lines, with each having a given spatial frequency, i.e., a horizontal set of lines, a vertical set of lines, a +45 degree set of lines, and a −45 degree set of lines. The four sets of lines at a given spatial frequency will be referred to as a shape set. The quads preferably are designed to have a constant frequency difference between adjacent shape sets. For example, the first shape set can comprise lines with a width of 0.266 $\mu$m (and thus have a spatial period of 0.532 $\mu$m.), the second shape set can comprise 0.235 $\mu$m lines, the third shape set can comprises 0.210 $\mu$m lines and so on until the last shape set comprises 0.160 $\mu$m lines. Of course patterns with larger spatial periods (i.e., 307 $\mu$m, 0.3625 $\mu$m) and/or smaller spatial periods (i.e., 148 $\mu$m) can also be used.

The reticle 902 can be used to expose resist to two different spatial frequencies to create Moire beat patterns in the resist. In particular, photoresist is exposed through reticle 902. The reticle is then indexed in the horizontal direction an amount equal to one shape set width (such that the 0.210 shape set now covers the region that was previous covered by the 0.235 shape set and so on). The resist is the exposed again. Thus each portion of the resist is exposed to two different spatial frequencies. For example, one portion is exposed through the 0.266 $\mu$m and 0.235 $\mu$m quads, another portion is exposed through the 0.235 $\mu$m and 0.210 $\mu$m shape sets and so on.

After development the resulting pattern can then be inspected to determine the amount of modulation that occurs at different spatial frequencies. This can then be used to evaluate the performance of the photolithography system as a function of spatial frequency. Additionally, by using the reticle 902 at different foci the performance of the lithography tool as a function of foci can be determined. This can be used to determine the focus properties of lens used in the photolithographic tool.

Thus, preferred embodiments provide a method and apparatus for visually inspecting features on a wafer that are smaller than can be optically resolved using normally using visible light. The preferred method patterns resist with two set of lines having different spatial frequencies. The two sets of lines combine to form a pattern in the resist that exhibits Moire beats. The Moire beat spatial frequency of the resulting pattern is significantly lower than the two spatial frequencies used, and thus can be visually inspected using light in the visible regions.

While the invention has been particularly shown and described with reference to a preferred exemplary embodiment thereof, it will be understood by those skilled in the art that various changes in form and details may be made therein without departing from the spirit and scope of the invention.

I claim:

1. A method for evaluating the performance of a lithography system, the method comprising the steps of:
    a) exposing a photoresist portion to a first pattern having a first spatial frequency;
    b) exposing said photoresist portion to a second pattern having a second spatial frequency; and
    c) developing said photoresist portion, said developing forming a beat pattern in said photoresist portion.

2. The method of claim 1 wherein said first pattern comprises a first plurality of lines, each of said first plurality of lines having a first width.

3. The method of claim 2 wherein said second pattern comprises a second plurality of lines, each of said second plurality of lines having a second width.

4. The method of claim 1 wherein said photoresist portion comprises photoresist having a high absorption coefficient.

5. The method of claim 1 wherein said beat pattern comprises a Moire beat pattern.

6. The method of claim 1 wherein said beat pattern comprises a continuous tone relief pattern proportional to the exposure dosage.

7. The method of calm 1 wherein the step of exposing a photoresist portion to a first pattern having a first spatial frequency comprises exposing said photoresist through a first reticle portion having a first spatial frequency.

8. The method of claim 7 wherein the step of exposing a photoresist portion to a second pattern having a second spatial frequency comprises exposing said photoresist through a second reticle portion having a second spatial frequency.

9. The method of claim 7 wherein said first reticle portion includes a set of horizontal lines having said first spatial frequency, a set of vertical lines having said first spatial frequency, a set of 45 degree lines having said first spatial frequency, and a set of minus 45 degree lines having said first spatial frequency, and wherein said second reticle portion includes a set of horizontal lines having said second spatial frequency, a set of vertical lines having said second spatial frequency, a set of 45 degree lines having said second spatial frequency, and a set of minus 45 degree lines having said second spatial frequency.

10. The method of claim 1 wherein the step of exposing a photoresist portion to a first spatial frequency comprises exposing said photoresist through a mask containing a plurality of mask portions, each of said mask portions having a different spatial frequency, and wherein the step of exposing said photoresist portion to a second spatial frequency comprises indexing said mask such that each of said mask portions is over a different region of said photoresist and exposing said photoresist through said mask.

11. The method of claim 10 wherein said mask portions have spatial frequencies such that adjacent mask portions have a constant spatial frequency difference.

12. The method of claim 10 wherein said mask portions each comprise a set of horizontal lines, a set of vertical lines, a set of 45 degree lines, and a set of minus 45 degree lines.

13. The method of claim 1 further comprising the step of visually inspecting said beat pattern in said photoresist.

14. The method of claim 1 further comprising the step of measuring the diffracted orders of said beat pattern.

15. A system for evaluating the performance of a photolithography system, the system comprising:
    a) a mask reticle containing a plurality of shape sets, each of said shape sets having a different spatial frequency; and
    b) a photoresist material comprising a plurality of photoresist portions, wherein said photoresist material is exposed through said mask reticle such that each of said photoresist portions is exposed to a first spatial frequency exposure and a second spatial frequency exposure, and wherein said first and second spatial frequency exposures combine to form a beat exposure pattern in each of said photoresist portions.

16. The system of claim 15 wherein each of said plurality of shape sets comprises a set of lines having a different spatial frequency.

17. The system of claim 15 wherein each of said plurality of shape sets has a spatial frequency such that the frequency difference between said first spatial frequency exposure and said second spatial frequency exposure of each of said photoresist portions is constant.

18. The system of claim 15 wherein each of said plurality of shape sets a comprises a set of horizontal lines, a set of vertical lines, a set of 45 degree lines and a set of minus 45 degree lines.

19. The system of claim 15 wherein said photoresist material has a high absorption coefficient.

20. The system of claim 15 wherein said photoresist is first exposed through said mask reticle, the mask reticle is then indexed such that said photoresist portions are aligned with a different shape set, and the photoresist is exposed a second time.

21. A method for evaluating the performance of a lithography system, the method comprising the steps of:
    a) depositing a layer of photoresist, said photoresist having a high absorb coefficient;
    b) exposing said photoresist layer through a mask, said mask including a plurality of shape sets, each of said shape sets having a different spatial frequency such that each portion of said photoresist layer is exposed to a different first spatial frequency;
    c) indexing said mask relative to said photoresist layer;
    d) exposing said photoresist layer such each of said photoresist portions is exposed to a different second spatial frequency and wherein the difference frequency between the first and second spatial frequency of each photoresist portion is the substantially the same;
    e) developing said resist, said developing forming a beat pattern in said photoresist; and
    f) visually inspecting said beat pattern in said photoresist.

22. The method of claim 21 each of said plurality of shape sets comprises a set of lines.

23. The method of claim 21 wherein each of said plurality of shape sets comprises a set of horizontal lines, a set of vertical lines, a set of 45 degree lines, and a set of minus 45 degree lines.

* * * * *